United States Patent [19]

Ishibe et al.

[11] Patent Number: 5,455,624
[45] Date of Patent: Oct. 3, 1995

[54] SOLID IMAGE PICK-UP ELEMENT

[75] Inventors: Shouichi Ishibe; Junichi Nakai; Yasuhiro Imanaka; Tetsuro Aoki, all of Fukuyama, Japan

[73] Assignee: Sharp Kabushiki Kaisha, Osaka, Japan

[21] Appl. No.: 183,917

[22] Filed: Jan. 19, 1994

Related U.S. Application Data

[63] Continuation of Ser. No. 898,965, Jun. 12, 1992, abandoned.

[30] Foreign Application Priority Data

Jun. 12, 1991 [JP] Japan ................... 3-139996

[51] Int. Cl.⁶ .................................. H04N 5/335
[52] U.S. Cl. .................... 348/340; 348/243; 257/223
[58] Field of Search ................... 348/294, 302, 348/311, 262, 263, 266, 272, 273, 277, 278, 279, 207, 340, 243; 257/223, 294, 435, 440; H04N 5/335

[56] References Cited

U.S. PATENT DOCUMENTS

| | | | |
|---|---|---|---|
| 4,649,430 | 3/1987 | Hynecek | 358/213 |
| 4,876,167 | 10/1989 | Snow et al. | 430/7 |
| 5,140,396 | 8/1992 | Needham et al. | 257/294 |
| 5,181,093 | 1/1993 | Kawaura | 257/223 |
| 5,258,608 | 11/1993 | Uchiya et al. | 250/208.1 |

FOREIGN PATENT DOCUMENTS

| | | | |
|---|---|---|---|
| 0289044 | 11/1988 | European Pat. Off. | H01L 31/02 |
| 58-30284 | 2/1983 | Japan | H04N 5/30 |
| 58-125968 | 7/1983 | Japan | H04N 5/30 |
| 63-185058 | 7/1988 | Japan | H01L 27/14 |
| 3-169078 | 7/1991 | Japan | H01L 27/148 |

OTHER PUBLICATIONS

High Density Cid Imagers—IEEE Journal of Solid–State Circuits, vol. SC13, No. 1, Feb. 1978.
Patent Abstracts of Japan; vol. 8, No. 99; (E–243) 10 May 1984 & JP–A–59 017 778 (Tokyo Shibaura Denki K.K.).
Patent Abstracts of Japan; vol. 8, No. 59 (E–232) (1496) 17 Mar. 1984 & JP–A–58 209 160 (Hitachi Sesakusho K.K.).
Patent Abstracts of Japan; vol. 7, No. 162 (E–187) (1307) 15 Jul. 1983 & JP–A–58 070 685 (Nippon Denki K.K.).
Patent Abstracts of Japan; vol. 12, No. 461 (E–689) (3308) 5 Dec. 1988 & JP–A–63 185 058 (Hitachi Ltd.).

*Primary Examiner*—Michael T. Razavi
*Assistant Examiner*—Tuan V. Ho
*Attorney, Agent, or Firm*—David G. Conlin; George W. Neuner

[57] ABSTRACT

A solid image pick-up element comprises a semiconductor substrate, a photoelectric transfer region formed on the substrate, and an optical black region formed on the substrate. Each of the photoelectric transfer region and the optical black region includes a plurality of regularly arrayed light receiving units. A shielding film is formed on the light receiving units of the optical black region and is covered with a shielding layer. Preferably, the shielding film comprises three color filters in red, green and blue. Even if the shielding film causes light leakage, the shielding layer makes light damp, thereby reducing the occurrence of light leakage.

3 Claims, 5 Drawing Sheets

SOLID IMAGE PICK-UP ELEMENT

This is a continuation of copending application Ser. No. 07/898,965, filed on Jun. 12, 1992, now abandoned.

BACKGROUND OF THE INVENTION

1. Field of the Invention

The present invention relates generally to a solid image pick-up element employing, for example, CCDs (charge coupled devices), and more particularly to a solid image pick-up element capable of compensating for changes in characteristics with temperature.

2. Description of the Prior Art

FIG. 1 schematically depicts a conventional solid image pick-up element of the interline transfer type in which CCDs are used as light receiving units. This element is provided with a photoelectric transfer region 102 and an optical black region 103, both of which are formed on a substrate 100. A large number of light receiving units 101 are horizontally and vertically regularly arrayed on both the photoelectric transfer region 102 and the optical black region 103. The light receiving units 101 of the optical black region 103 are covered with a shielding film (shown by hatching) made of, for example, Al, AlSi or the like. The photoelectric transfer region 102 is provided for performing image pick-up whereas the optical black region 103 is provided for compensating signals detected by the photoelectric transfer region 102 for changes with temperature.

More specifically, at the optical black region 103, although incident light is shut off by the shielding film and the dark current is detected, the dark current is also affected by the change in temperature, as is the case with the signals detected by the photoelectric transfer region 102. Because of this, compensation is performed by subtracting the dark current from an output value detected by the photoelectric transfer region 102, thereby restraining the reduction of the dynamic range in vertical CCD registers (charge read units)104. Each of the vertical CCD registers 104 is interposed between two adjoining vertical rows of the light receiving units 101 or is formed on the left-hand side of the leftmost vertical row of the light receiving units 101, as viewed in FIG. 1. The vertical CCD registers 104 read and transfer signal charges generated in the light receiving units 101.

In the above-described conventional element, the shielding film is made comparatively thin, for example about 1 μm thick, thereby preventing the generation of pin holes or the lowering in processability, which may be caused if the shielding film is made thick. After the formation of the shielding film, heat treatment such as, for example, $H_2$ annealing is performed for the purpose of enhancing the quality of the substrate. This kind of heat treatment, however, occasionally makes crystals grow upon deposition thereof, thereby producing cracks in the shielding film. Such cracks allow light, though it is slight, to enter the light receiving units 101 of the optical black region 103, thus causing light leakage. Furthermore, at the optical black region 103, a silicon oxide insulation film 106 is interposed between the substrate 100 and the shielding film 105, and the upper surface thereof has undulations, for example, across a height of about 1 μm at regions A, as shown in FIG. 2. The presence of such undulations lower the covering state of the shielding film 105, thereby occasionally causing light leakage at the regions A. If the light leakage occurs at the optical black region 103, the dark current value varies and correct temperature compensation cannot be performed.

It is conceivable that plural layers of shielding films are superimposed one upon another to prevent light leakage. This structure, however, cannot prevent the occurrence of pin holes or light leakage from between metallic grains. Furthermore, the formation of the plural layers of shielding films inevitably needs additional processes.

SUMMARY OF THE INVENTION

The present invention has been developed to overcome the above-described disadvantages.

It is accordingly an object of the present invention to provide a solid image pick-up element capable of restraining the reduction of the dynamic range in charge read units and preventing light leakage at an optical black region for correct temperature compensation.

In accomplishing this and other objects, a solid image pick-up element according to the present invention comprises a semiconductor substrate, a plurality of light receiving units formed on the substrate, means for sequentially reading electric signals obtained through photoelectric transfer of light applied to the light receiving units, an optical black region formed on the substrate and including a portion of the light receiving units, a shielding film formed on the light receiving units of the optical black region, and a shielding layer formed on the shielding film. Both the shielding film and the shielding layer shield light from entering the light receiving units of the optical black region.

In the above-described structure, because the shielding film provided for forming the optical black region is covered with the shielding layer, the shielding layer makes light damp even if the shielding film causes light leakage. Accordingly, it is unlikely that light leakage would occur at the optical black region.

BRIEF DESCRIPTION OF THE DRAWINGS

This and other objects and features of the present invention will become more apparent from the following description of a preferred embodiment thereof with reference to the accompanying drawings, throughout which like parts are designated by like reference numerals, and wherein.

DETAILED DESCRIPTION OF THE PREFERRED EMBODIMENTS

Figure 1:
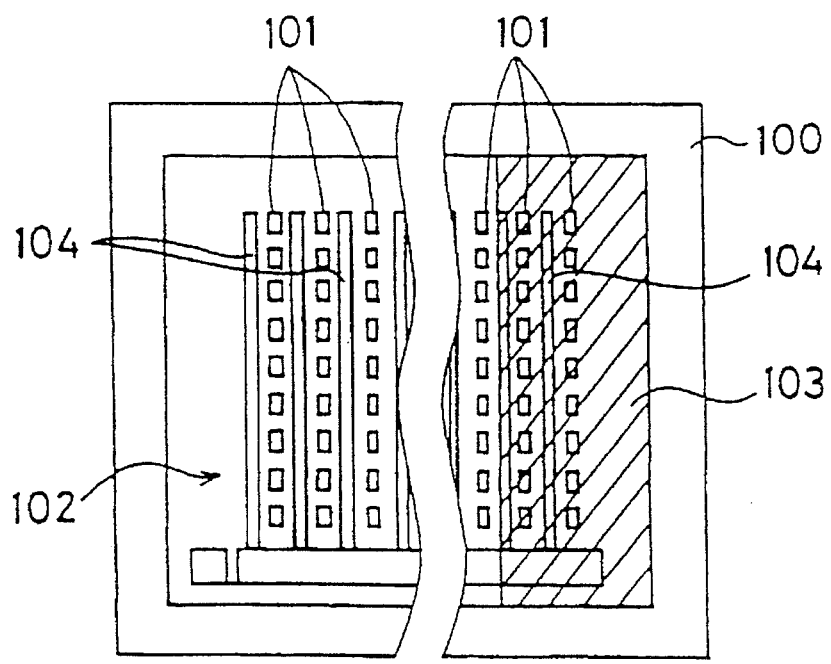
FIG. 1 is a top plan view of a conventional solid image pick-up element.
Figure 2:
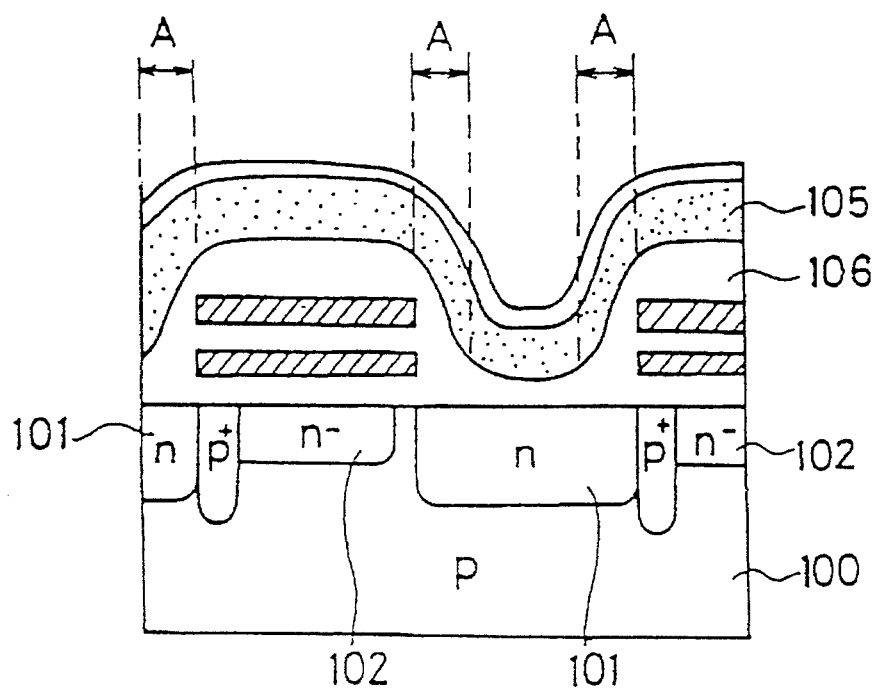
FIG. 2 is a cross-sectional view of an optical black region of the element of FIG. 1.
Figure 3:
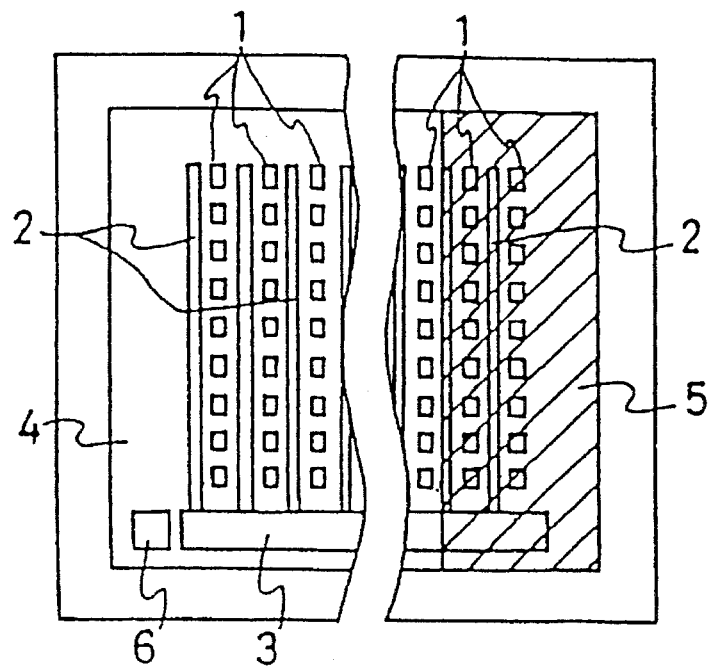
FIG. 3 is a top plan view of a solid image pick-up element embodying the present invention.

Referring now to the drawings, there is schematically shown in FIG. 3 a solid image pick-up element according to the present invention, which comprises a large number of horizontally and vertically regularly arrayed light receiving units 1 each comprising a pn junction photodiode, a plurality of vertical CCD registers 2 interposed between two adjoining vertical rows of the light receiving units 1 or otherwise formed on the left-hand side of the leftmost vertical row of the light receiving units 1, as viewed in FIG. 3, and a horizontal CCD register 3 connected with lower ends of the vertical CCD registers 2. This element also comprises a shielding film (shown by hatching) made of, for example, Al, AlSi or the like and covered on a portion of the light receiving units 1. A portion not covered with the shielding film forms a photoelectric transfer region 4 whereas another portion covered with the shielding film forms an optical black region 5 where the shielding film prevents light from entering.

Figure 4:
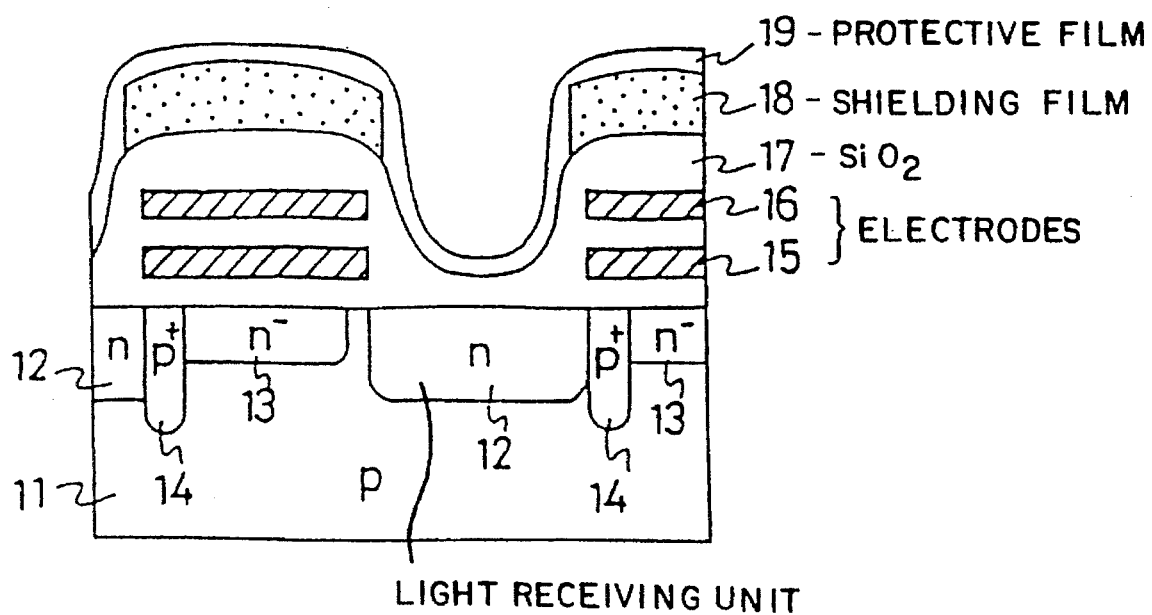
FIG. 4 is a cross-sectional view of a photoelectric transfer region of the element of FIG. 3.

FIG. 4 depicts the structure of the photoelectric transfer region 4 where a plurality of n-layers 12 are formed on the surface of a p-type silicon substrate 11. The n-layers 12 are of the reverse conductivity type of the substrate 11 and correspond to the light receiving units 1. In the proximity of the n-layers 12 are formed n⁻-layers 13 corresponding to the vertical CCD registers 2. A channel stopper 14 is interposed between an n-layer 12 and an n⁻-layer 13 and is positioned on the left-hand side of the n⁻-layer 13, as viewed in FIG. 4. A silicon oxide insulation layer 17 is formed on the substrate 11, and plural sets of two opposed first and second polysilicon electrodes 15 and 16 are embedded therein. A plurality of shielding films 18 are formed on the surface of the silicon oxide insulation layer 17 at locations above the second polysilicon layers 16. The shielding films 18 are made of the same material as the shielding film formed at the optical black region 5. Both the silicon oxide insulation layer 17 and the shielding films 18 formed thereon are entirely covered with a protective film 19.

Figure 5:
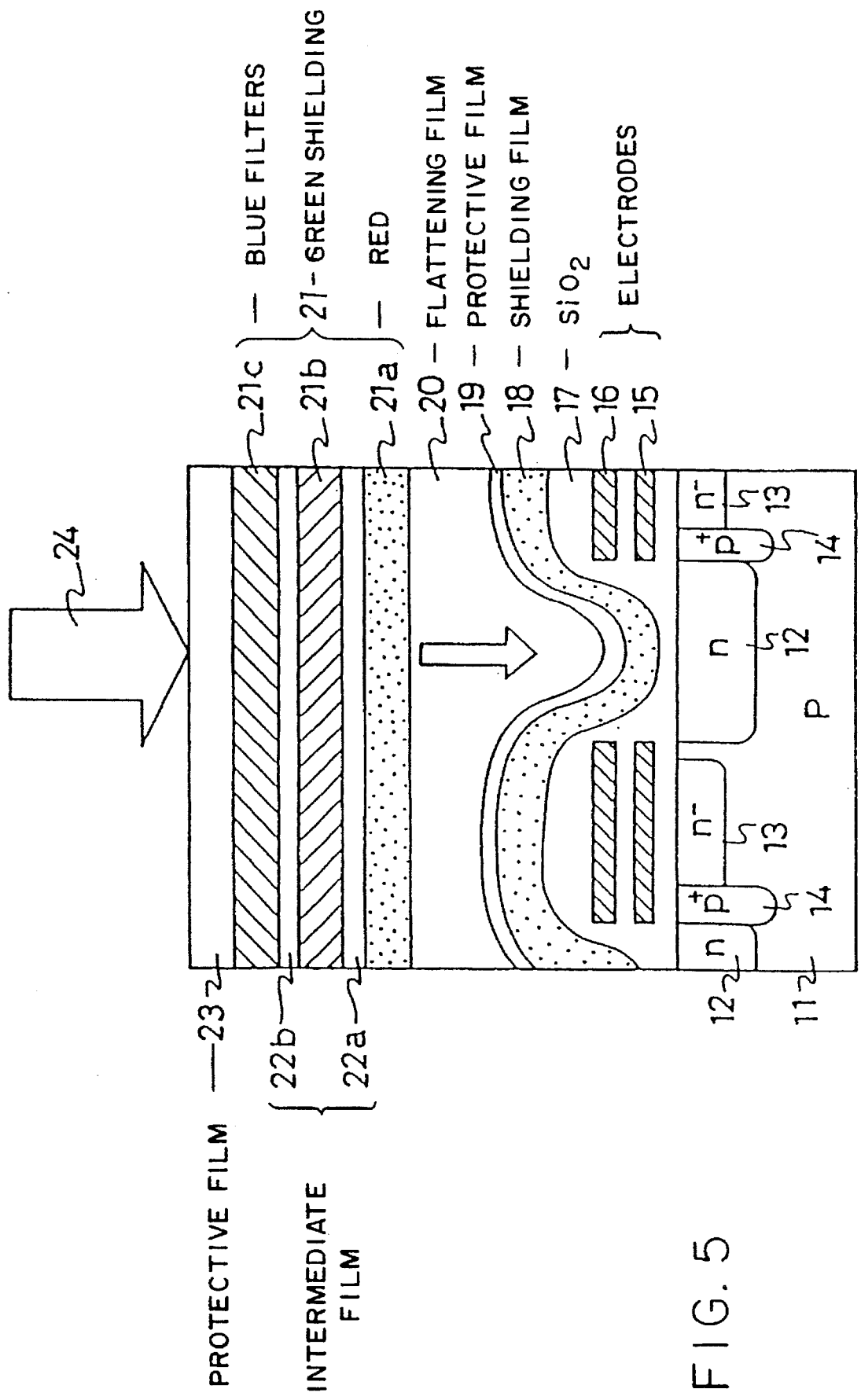
FIG. 5 is a cross-sectional view of an optical black region of the element of FIG. 3.

FIG. 5 depicts the structure of the optical black region 5. The optical black region 5 has a lower structure similar to that of the photoelectric transfer region 4 and an upper structure different from that of the photoelectric transfer region 4.

More specifically, a plurality of n-layers 12 are formed on the surface of the p-type silicon substrate 11. The n-layers 12 are of the reverse conductivity type of the substrate 11 and correspond to the light receiving units 1. 10 In the proximity of the n-layers 12 are formed n⁻-layers 13 corresponding to the vertical CCD registers 2. A channel stopper 14 is interposed between an n-layer 12 and an n⁻-layer 13 and is positioned on the left-hand side of the n⁻-layer 13, as viewed in FIG. 5. A silicon oxide insulation layer 17 is formed on the substrate 11, and plural sets of two opposed first and second polysilicon electrodes 15 and 16 are embedded therein. The silicon oxide insulation layer 17 is entirely covered with a shielding film 18, which is entirely covered with a protective film 19. Furthermore, a flattening film 20 having a generally flat upper surface, a shielding layer 21, and a protective film 23 are formed in this order on the protective film 19. The shielding layer 21 comprises three color filters 21a, 21b and 21c in red, green and blue and two intermediate films 22a and 22b. The intermediate film 22a is interposed between the lowermost red filter 21a and the middle green filter 21b whereas the intermediate film 22b is interposed between the green filter 21b and the uppermost blue filter 21c. In the formation of the color filters 21a–21c, a photosensitive material is initially added to gelatin, casein or the like to impart patterning properties. Thereafter, dyeing or scattering is performed by the use of appropriate dye or pigment, respectively.

The element having the above-described structure electrically operates as follows. When light enters the photoelectric transfer region 4, signal charges are generated and accumulated in the n-layers 12 of the light receiving units 1. Thereafter, the charges are transferred to the vertical CCD registers 2 and to the horizontal CCD register 3 by transfer clock pulses. The charges are then read out as voltage signals via an output portion 6 located in the proximity of the horizontal CCD register 3.

At this moment, the optical black region 5 can restrain light 24 from entering the light receiving units 1 because the shielding film 18 and the shielding layer 21 including the three color filters 21a–21c are formed on the light receiving units 1. If the optical black region 5 has no films or layers on the protective film 19 and is subjected to heat treatment such as, for example, H₂ annealing, it is likely that the shielding film 18 may cause light leakage. However, because the optical black region 5 has the color films 21a–21c above the shielding film 18, the color films 21a–21c make the incident light 24 damp to the amount below 30%. In this way, the optical black region 5 considerably reduces the amount of the incident light 24 reaching the light receiving units 1 via the shielding film 18.

Accordingly, the element according to the present invention can correctly detect the dark current changing with temperature, and therefore, can perform correct temperature compensation. Furthermore, because part of a large number of light receiving units 1 are covered with a shielding layer to form the optical black region 5, the dynamic range in charge read units (vertical CCD registers 2) is restrained from reducing.

Figure 6:
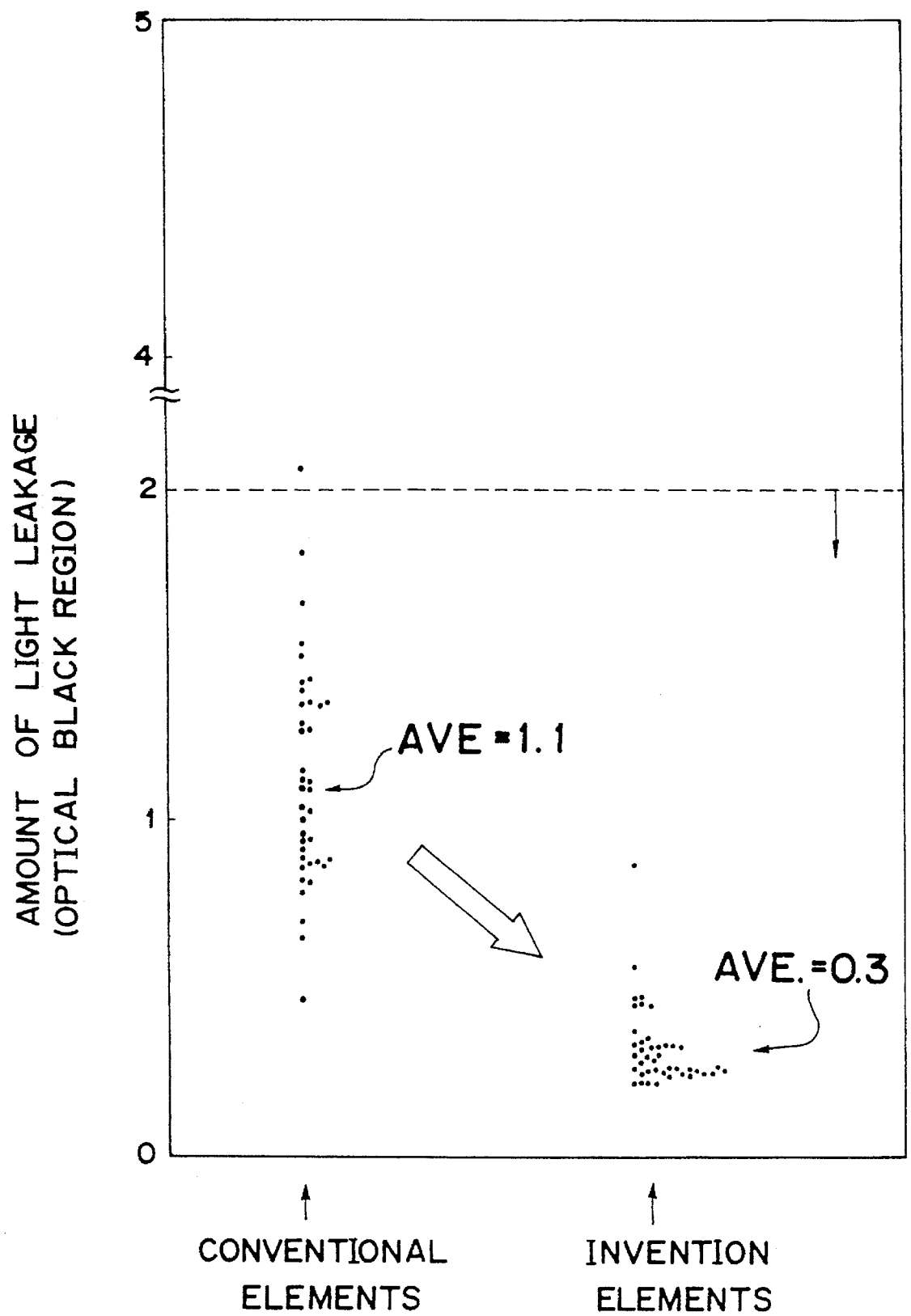
FIG. 6 is a graph indicative of the result of measurements in the amount of light leakage.
Figure 7:
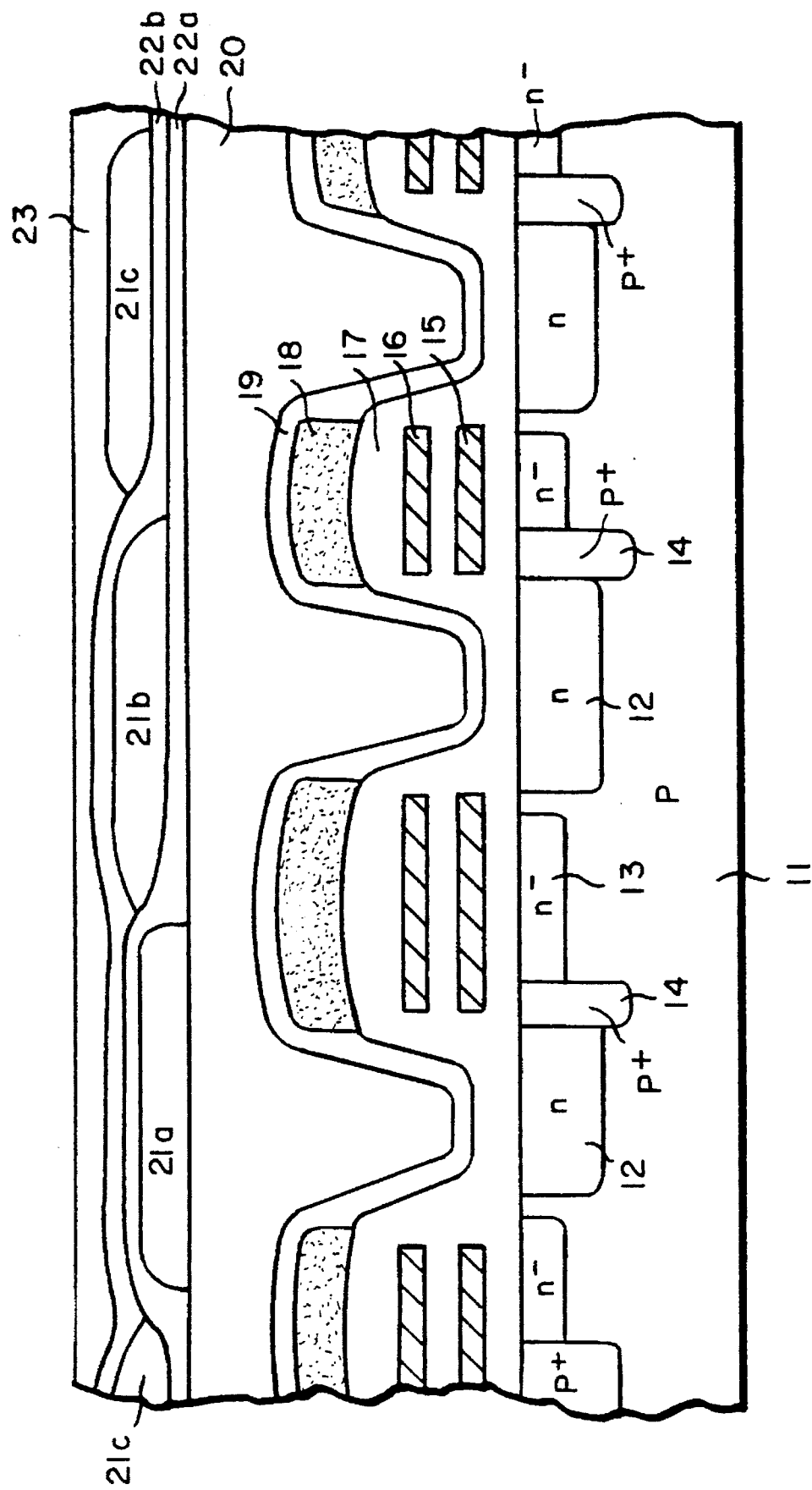
FIG. 7 is a cross-sectional view of the photoelectric transfer region illustrated in FIG. 4, further illustrating an embodiment of a shielding layer in accord with the present invention.

FIG. 6 is a graph indicative of the result of measurements in which the amount of light leakage was measured with respect to elements having a shielding layer and those having no shielding layer. Prior to the measurements, an AlSi shielding film 18 or 105 having a thickness of 1.1 μm was formed on an insulation layer 17 or 106. Thereafter, a shielding layer 21 comprising three filters 21a–21c made of gelatin and each having a thickness of 0.8 μm was formed on the shielding film 18 only. Upon application of light having an illuminance of 1500 luxes, the value of electric current generated at the photoelectric transfer region was measured by a tester. This value also includes a current value corresponding to the amount of light leakage.

As shown in the graph of FIG. 6, the relative ratio in the average amount of light leakage between the elements having a shielding layer and those having no shielding layer was 0.3:1.1. It can be readily understood from this graph that the provision of the shielding layer can considerably reduce the amount of light leakage at the optical black region.

In applications where the present invention is applied to a solid image pick-up element with color filters, the color filters can be formed in the photoelectric transfer region simultaneously with those utilized as a shielding layer at the optical black region.

In the above-described embodiment, although a shielding layer comprises three color filters in red, green and blue, the shielding layer may comprise plural filters in other colors or only one filter colored by the use of black dye.

Moreover, the present invention is applicable to a frame transfer type solid image pick-up element or the like as well as an interline transfer type one. In other words, the present invention is applicable to all solid image pick-up elements having light receiving units formed on a semiconductor substrate, means for sequentially reading signals obtained through photoelectric transfer, and an optical black region formed at a portion thereof.

As is clear from the above, because a solid image pick-up element according to the present invention is provided with a shielding layer at an optical black region covered with a shielding film, the optical black region can prevent light leakage to light receiving units, thereby correctly compensating an output value from an photoelectric transfer region for the amount of changes with temperature and preventing the dynamic range in charge read units from reducing.

Furthermore, color filters serviceable as a shielding layer of the optical black region can be readily formed merely by changing photomasks, and therefore, no additional processes are needed.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A solid image pick-up element comprising:

a semiconductor substrate;

a photoelectric transfer region formed on said semiconductor substrate;

a plurality of first light receiving units arrayed at said photoelectric transfer region;

means for sequentially reading electric signals obtained through photoelectric transfer of a first light applied to said first light receiving units;

an optical black region formed on said semiconductor substrate;

a plurality of second light receiving units arrayed at said optical black region;

a shielding film, formed on said second light receiving units, for shielding second light from entering said second light receiving units, the shielding film being formed continuously over the optical black region; AND a shielding layer, formed on said shielding film, for further shielding said second light from entering said second light receiving units;

wherein said shielding layer comprises three color filters in red, green and blue, and extends continuously over the shielding film in the optical black region.

2. A solid image pick-up element comprising:

a semiconductor substrate;

a photoelectric transfer region formed on said semiconductor substrate;

a plurality of first light receiving units arrayed at said photoelectric transfer region;

means for sequentially reading electric signals obtained through photoelectric transfer of first light applied to said first light receiving units;

an optical black region formed on said semiconductor substrate;

a plurality of second light receiving units arrayed at said optical black region;

a shielding film, formed on said second light receiving units and extending continuously over the entire optical black region, for shielding second light from entering said second light receiving units;

a shielding layer, formed on said shielding film and extending continuously over said shielding film in the entire optical black region, for further shielding said second light from entering said second light receiving units; and a plurality of color filters formed at said photoelectric transfer region, wherein said shielding layer comprises said color filters placed one upon another.

3. The solid image pick-up element according to claim 2, wherein said shielding layer comprises all of said color filters placed one upon another.

* * * * *